(12) United States Patent
Strotmann et al.

(10) Patent No.: US 8,317,078 B1
(45) Date of Patent: Nov. 27, 2012

(54) METHOD AND APPARATUS FOR ULTRASONIC WELDING OR BONDING

(75) Inventors: Guido Strotmann, Anröchte (DE); Achim Cordes, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/327,137

(22) Filed: Dec. 15, 2011

Related U.S. Application Data

(63) Continuation-in-part of application No. 13/249,326, filed on Sep. 30, 2011.

(51) Int. Cl.
*B23K 1/06* (2006.01)
(52) U.S. Cl. ........................ 228/110.1; 228/1.1
(58) Field of Classification Search ............... 228/110.1, 228/1.1
See application file for complete search history.

(56) References Cited

U.S. PATENT DOCUMENTS

2002/0121292 A1* 9/2002 Betrabet et al. ................. 134/34
* cited by examiner

*Primary Examiner* — Nicholas D'Aniello
(74) *Attorney, Agent, or Firm* — Murphy, Bilak & Homiller, PLLC

(57) ABSTRACT

A method and an apparatus for ultrasonic welding of a first workpiece to a second workpiece is disclosed. The two workpieces are clamped between a sonotrode and an anvil so that the two workpieces are in mechanical contact with each other, the first workpiece is in mechanical contact with the sonotrode and the second workpiece rests on the anvil. Fluid is introduced between the second workpiece and the anvil so that the second workpiece at least partly rests on the fluid. The fluid is frozen so that the fluid forms a solid body. Ultrasonic vibrations are applied to the first workpiece by the sonotrode for a period of time.

14 Claims, 9 Drawing Sheets

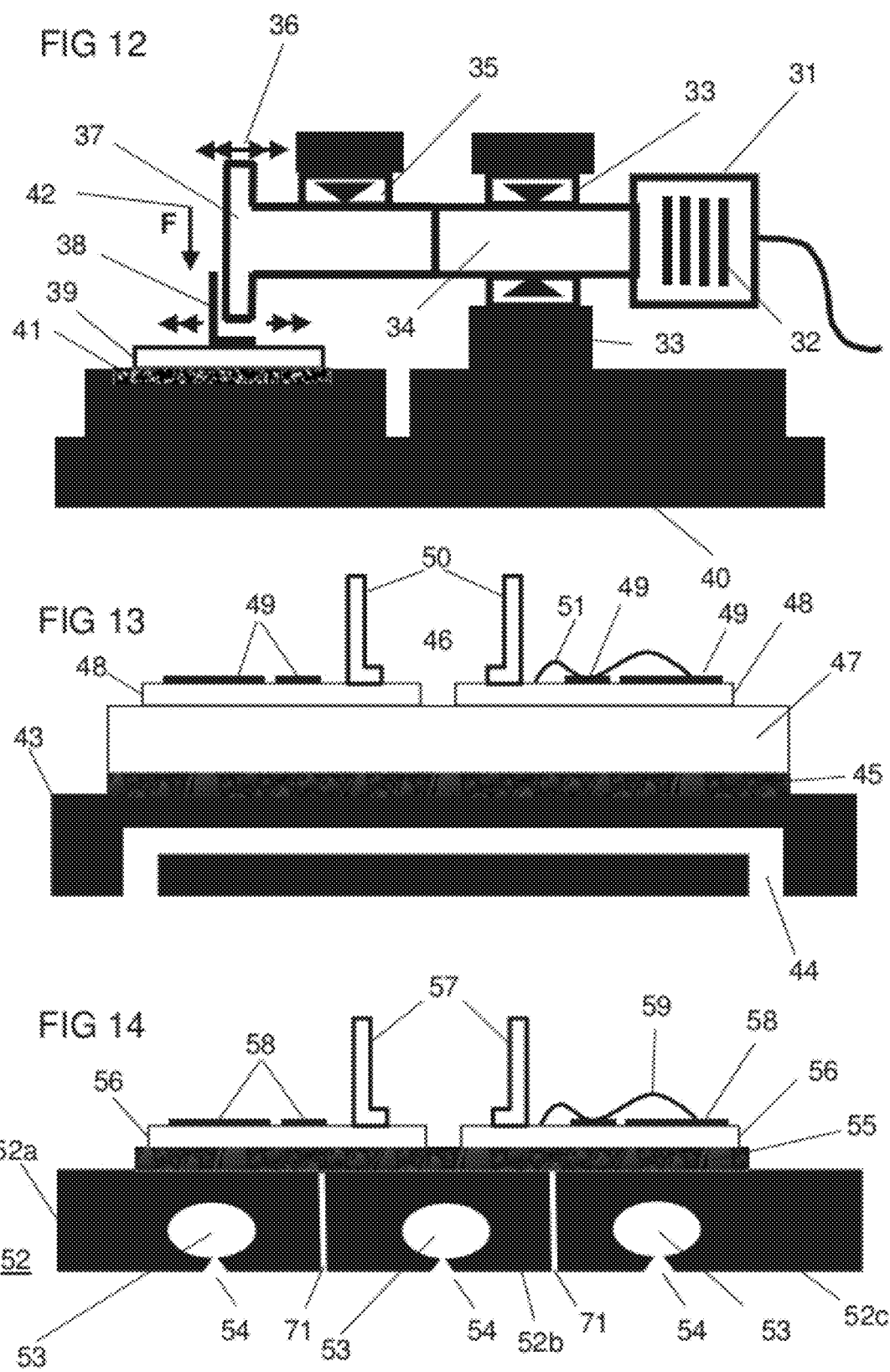

METHOD AND APPARATUS FOR ULTRASONIC WELDING OR BONDING

PRIORITY CLAIM

This application is a continuation-in-part of U.S. patent application Ser. No. 13/249,326 filed on Sep. 30, 2011, said application incorporated herein by reference in its entirety.

TECHNICAL FIELD

The invention relates to a method and an apparatus for ultrasonic welding or bonding

BACKGROUND

Ultrasonic welding of various materials is known. The process involves vibrating overlapping or adjacent workpieces clamped between a sonotrode and an anvil. Frictional forces occurring between the vibrating workpieces create a bond or weld that occurs at the interface between the workpieces, effectively joining them to one another. Accordingly, various sonotrode and anvil surface configurations, i.e., the surfaces that contact the workpieces, are known and used to transfer energy from the sonotrode to the aforementioned interface. Such configurations attempt to reduce the energy loss at the sonotrode/workpiece interface or the anvil/workpiece interface thereby increasing the energy to the workpiece/workpiece interface and increasing the overall efficiency of the ultrasonic welding apparatus. However, there is no solution addressing the anvil/workpiece interface problem that is considered satisfactory. There is a general need for an improved anvil/workpiece interface.

SUMMARY

One embodiment is directed to a method for ultrasonic welding of a first workpiece to a second workpiece. The method comprises: clamping the two workpieces between a sonotrode and an anvil so that the two workpieces are in mechanical contact with each other, the first workpiece is in mechanical contact with the sonotrode, and the second workpiece rests on the anvil; introducing fluid between the second workpiece and the anvil so that the second workpiece at least partly rests on the fluid; freezing the fluid so that the fluid forms a solid body; and applying ultrasonic vibrations to the first workpiece by the sonotrode for a period of time.

Another embodiment is directed to an apparatus for ultrasonic welding of a first workpiece to a second workpiece. The apparatus comprises: a sonotrode mechanically coupled to a transducer and configured to emit ultrasonic vibrations that are applied to the first workpiece; an anvil configured to be immobile in response to the ultrasonic vibrations; a pressing tool configured to clamp the two workpieces between the sonotrode and the anvil; and a fluid dispensing system configured to introduce fluid between the second workpiece and the anvil.

Those skilled in the art will recognize additional features and advantages upon reading the following detailed description, and upon viewing the accompanying drawings.

BRIEF DESCRIPTION OF THE DRAWINGS

Various specific embodiments are described in more detail below based on the exemplary embodiments shown in the figures of the drawing. Unless stated otherwise, similar or identical components are labeled in all of the figures with the same reference numbers.

FIG. 12 is a schematic diagram illustrating another exemplary improved ultrasonic welding apparatus.

FIG. 13 is a schematic diagram illustrating an exemplary improved freezer anvil for ultrasonic welding and bonding in which liquid coolants are used for refrigeration.

FIG. 14 is a schematic diagram illustrating an exemplary improved freezer anvil for ultrasonic welding and bonding in which expansion of compressed gas is used for refrigeration.

DETAILED DESCRIPTION

Ultrasonic welding is an industrial technique whereby high-frequency ultrasonic acoustic vibrations are locally applied to workpieces being held together under pressure to create a solid-state weld. It is commonly used for plastics, metals, and compounds thereof. It is especially suited for joining dissimilar materials. In ultrasonic welding, there are no connective bolts, nails, soldering materials, or adhesives necessary to bind the materials together.

The parts are sandwiched between a fixed shaped anvil (also known as nest) and a sonotrode (also known as horn) connected to a transducer that emits a low-amplitude acoustic vibration at a frequency of more than 20 kHz. The anvil is immobile in response to ultrasonic vibrations generated by the welding process. When welding plastics, the interface of the two parts is specially designed to concentrate the melting process. One of the materials usually has a spiked energy director which contacts the second plastic part. The ultrasonic energy melts the point contact between the parts, creating a joint. Ultrasonic welding can also be used to weld metals, but are typically limited to small welds of thin, malleable metals, e.g. aluminum, copper, nickel.

Ultrasonic welding of thermoplastics causes local melting of the plastic due to absorption of vibration energy. The vibrations are introduced across the joint to be welded. In metals, ultrasonic welding occurs due to high-pressure dispersion of surface oxides and local motion of the materials. Although there is heating, it is not enough to melt the base materials. Vibrations are introduced along the joint being welded.

Benefits of ultrasonic welding are that it is much faster than conventional adhesives or solvents, drying time is very quick, and the pieces do not need to remain in a jig for long periods of time waiting for the joint to dry or cure. The welding can easily be automated also, making clean and precise joints.

Common ultrasonic welding systems are composed of the same basic elements: a) an anvil (nest) where the workpieces to be assembled are placed and allowing the high frequency vibration to be directed to the interfaces, b) a press to put the two workpieces to be assembled under pressure, i.e., to clamp the workpieces, c) an ultrasonic source composed of an electronic ultrasonic generator, a transducer (also known as converter) that converts the electrical signal from the generator into a mechanical vibration and an optional booster, and d) a sonotrode (horn) that applies the mechanical vibration to the workpieces to be welded.

Figure 1:
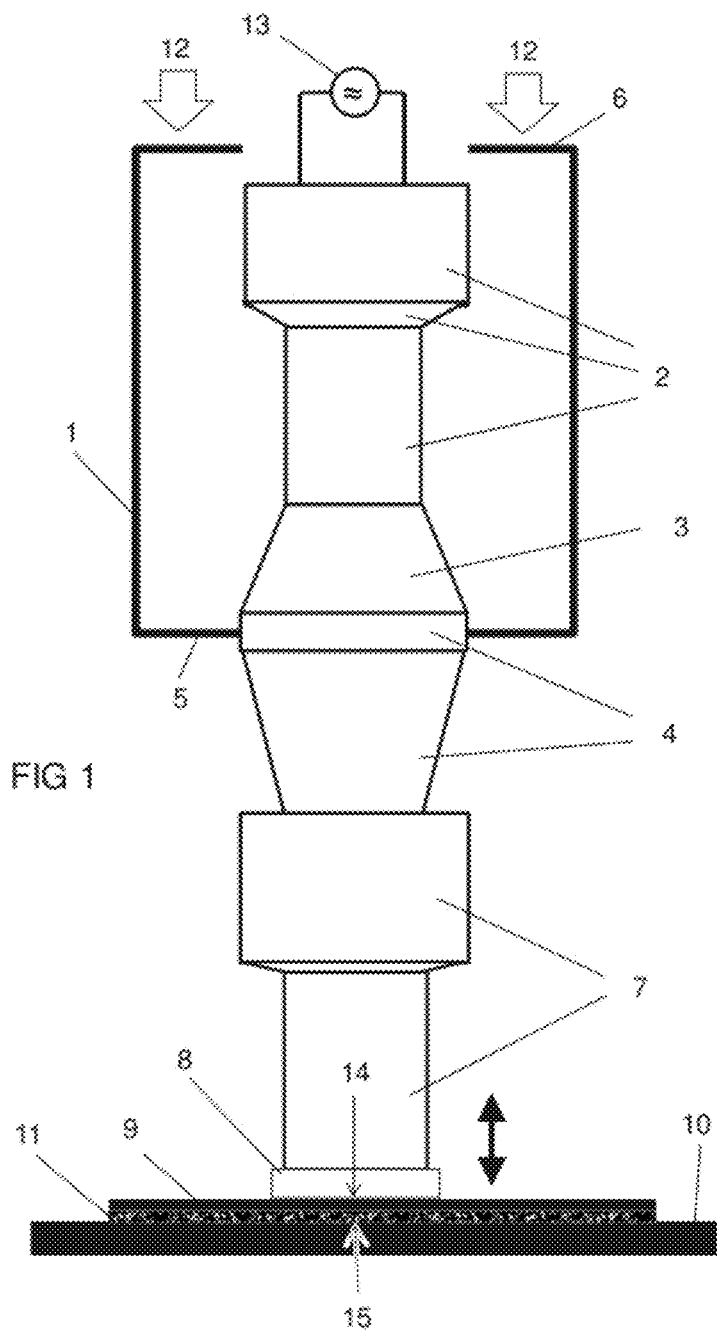
FIG. 1 is a schematic diagram illustrating an exemplary improved ultrasonic welding apparatus.

Reference is now made to FIG. 1, which is a schematic diagram illustrating an exemplary ultrasonic welding apparatus for, in particular, ultrasonic welding of plastics with an improved workpiece/anvil interface. In a vertically arranged, tube-like carriage 1 a transducer 2, a booster 3 and a support collar 4 are arranged such that the transducer 2 rests on the booster 3 which rests on the support collar 4. The carriage 1 includes a bottom plate 5 and a top plate 6 with openings. The support collar 4 is mounted in the opening of the bottom plate 5 and rests on a sonotrode 7 which is in direct mechanical contact with a first workpiece 8, e.g., a contact element of a power-semiconductor module. The first workpiece 8 is in mechanical contact with a second workpiece 9, e.g., a plate-like ceramic substrate, a metallic base plate or a compound thereof as used in power-semiconductor modules. The second workpiece 9 rests on a flat upper surface of an anvil 10 but is not in direct mechanical contact with the anvil 10 as a fluid layer 11 (or fluid film) such as oil is arranged in between. A welding force 12 is applied to the carriage at its top plate 6 such that the two workpieces 8, 9 are clamped between the sonotrode 7 and the anvil 10. The welding force 12 may be generated by a mechanical system (e.g. a spring or weight), a hydraulic system or by a pneumatic system which form in connection with the carriage 1, the support collar 4, the sonotrode 7 and the anvil 10 the press. The ultrasonic vibrations superposing the welding force 12 are provided by the transducer 2 which is electrically connected to an electronic ultrasonic generator 13. A sonotrode/workpiece interface 14 includes the sonotrode 7 and the first workpiece 8, and a workpiece/anvil interface 15 includes the anvil 10, the second workpiece 9 and the fluid layer 11.

The electronic ultrasonic generator 13, the transducer 2, the booster 3, the support collar 4 and the sonotrode 7 are specifically tuned to resonate at the same exact ultrasonic frequency (i.e., a frequency above 20 kHz). The booster 4 modifies the amplitude of the vibration and, further, may be used to clamp the stack in the press. The electronic ultrasonic generator 13 (also known as AC power supply) delivers a high power AC signal with a frequency matching the resonance frequency of transducer 2 and sonotrode 7. An optional controller (not shown) may control the movement of the press and the delivery of the ultrasonic energy.

The electronic ultrasonic generator 13 (power supply) changes mains electricity at a frequency of 50-60 Hz, into a high frequency electrical supply operating at, for instance, 20, 30 or 40 kHz. This electrical energy is supplied to the transducer 2. Within the transducer 2, discs of piezoelectric material are sandwiched between two metal sections. The transducer 2 changes the electrical energy into mechanical vibratory energy at ultrasonic frequencies. The vibratory energy is then transmitted through the booster 3, which increases the amplitude of the sound wave. The sound waves are then transmitted through the support collar 4 to the sonotrode 7. The sonotrode 7 is an acoustic tool that transfers the vibratory energy directly to the parts being assembled, and the sonotrode 7 also applies the welding force (welding pressure) to the workpieces. The vibrations are transmitted through the first workpiece 8 to the joint area. Here the vibratory energy joins the parts together as outlined above.

Figure 2:
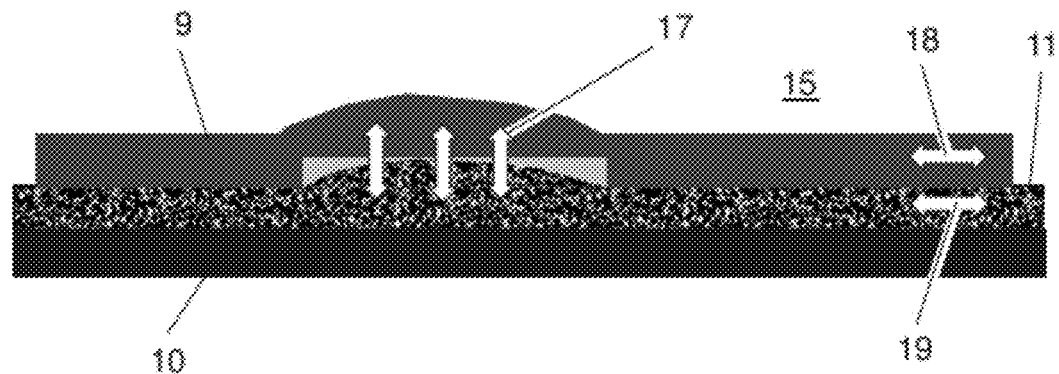
FIG. 2 is a schematic diagram illustrating in detail the motion distribution in the workpiece/anvil interface of the apparatus shown in FIG. 1.

FIG. 2 is a schematic diagram illustrating in detail the motion (or force) distribution in the workpiece/anvil interface 15 of the apparatus shown in FIG. 1. Commonly, the second workpiece 9 or the anvil 10 or both are not exactly planar/coplanar over their entire surfaces. Thus, a common workpiece/anvil interface includes one or more cavities filled with air between the second workpiece 9 and the anvil 10. The air in the cavities is resilient and, therefore, compensates for the counterforce established by the anvil 10. The partial lack of counterforce allows the workpieces to oscillate and reduces the quality of the bond.

An exemplary cavity 16 is depicted in FIG. 2. However, in the embodiment shown in FIG. 2, the cavity 16 is filled with fluid that forms part of the fluid layer 11. Fluid is depicted in the drawing by doted areas. Due to its fluid nature, the fluid layer 11 fills every single cavity regardless the size it may have, when a certain pressure of the fluid is maintained, e.g., by the press that clamps the workpieces to each other. In contrast, the fluid behavior is absolutely different in terms of ultrasonic vibration (i.e., vertical movement 17 of the sonotrode 7) in that the fluid layer 11 exhibits a behavior similar to that of a solid body. This solid body forms a "virtual" anvil resting on the actual anvil 10 and providing the necessary counterforce all over.

It provides not only a counterforce for downward movement of the sonotrode 7, but also for upward movement as certain decompression in the fluid occurs when the second workpiece 9 moves upward and the decompression practically "sucks" the second workpiece 9 to the anvil 10. Another positive effect of the fluid layer 11 is that lateral movements 18 of the second workpiece 9 are damped by counteracting shearing forces 19 developing in the fluid layer 11. Therefore, the second workpiece 9 is haltered in an absolute stable position.

Figure 3:
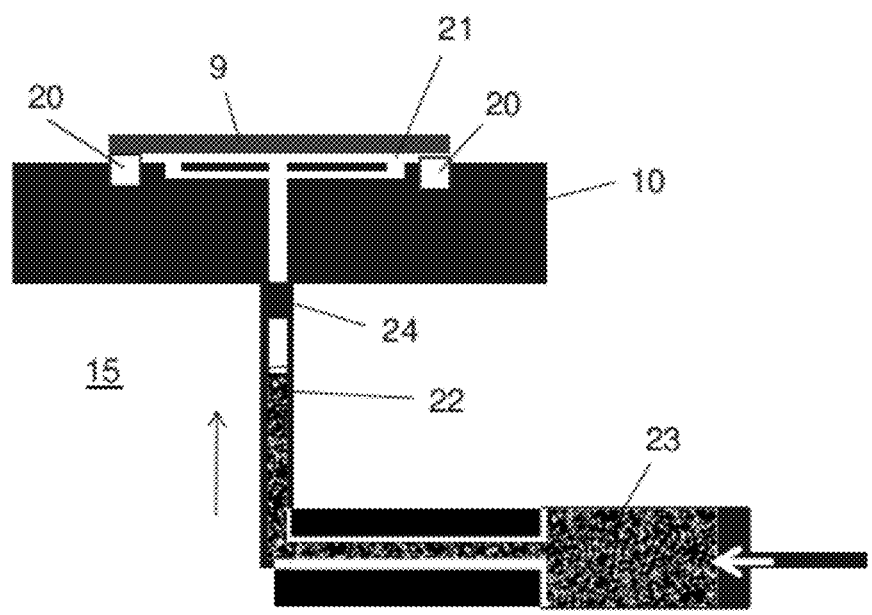
FIG. 3 is a schematic diagram illustrating in detail an exemplary workpiece/anvil interface applicable in the apparatus of FIG. 1 in a state of rest.

FIG. 3 shows an exemplary workpiece/anvil interface 15 in a state of rest that is applicable in the apparatus of FIG. 1. The workpiece/anvil interface 15 has an additional elongated (resilient) seal 20 that circumvents, e.g., a rectangular cross-section and is arranged in a closed loop with a loop shape and size corresponding to the lower surface of the second workpiece 9. The second workpiece 9 rests at its edge areas on the seal 20, thereby creating a cavity 21 under the second workpiece 9 that extends over most parts of the lower surface of the second workpiece 9. The cavity 21 is connected to a dispenser (fluid supply) system that includes a tube 22 (or hose) with branches connecting the cavity 21 to one end of the tube 22, a pump 23 connected to the other end of the tube 22, and a filter 24 connected between the pump 23 and the cavity 21. The filter 24 is configured to retain small particles such as dirt, swarf, cuttings etc. In the state of rest as shown, the pump 23 is relaxed so that the fluid in the tube 22 does not enter the cavity 21.

Figure 4:
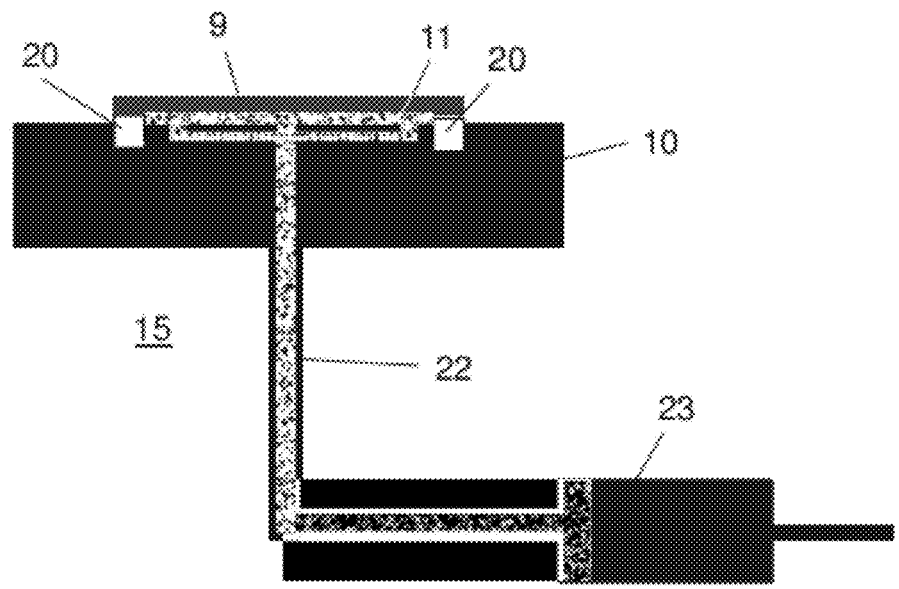
FIG. 4 is a schematic diagram illustrating in detail the workpiece/anvil interface of FIG. 3 in a filled-up state.

FIG. 4 shows the workpiece/anvil interface 15 of FIG. 3 in a filled-up state. The pump 23 pumps under pressure the fluid into the cavity 21 thereby filling the cavity 21 totally (filled-up state) and creating the fluid layer 11. In this state, no welding force is applied to the second workpiece 9 so that fluid may leak through apertures between the seal 20 and the second workpiece 9.

Figure 5:
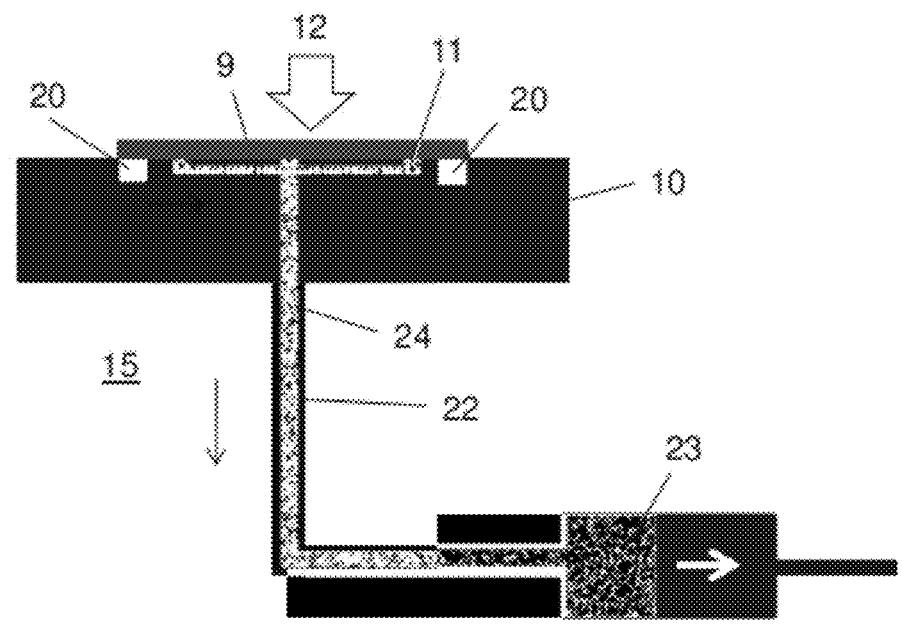
FIG. 5 is a schematic diagram illustrating in detail the workpiece/anvil interface of FIG. 3 in a tightened state.

FIG. 5 shows the workpiece/anvil interface 15 of FIG. 3 in a tightened state. In this state, welding force 12 is applied to the second workpiece 9 pressing the second workpiece 9 against the seal 20 so that no fluid drains anymore through the apertures. However, the welding pressure 12 forces a certain quantity of fluid back to the pump 23. This action may be supported by the pump 23 by reducing pumping pressure or even reverse the pressure, i.e., sucking the fluid into the pump 23. The apparatus is now ready for welding.

Figure 6:
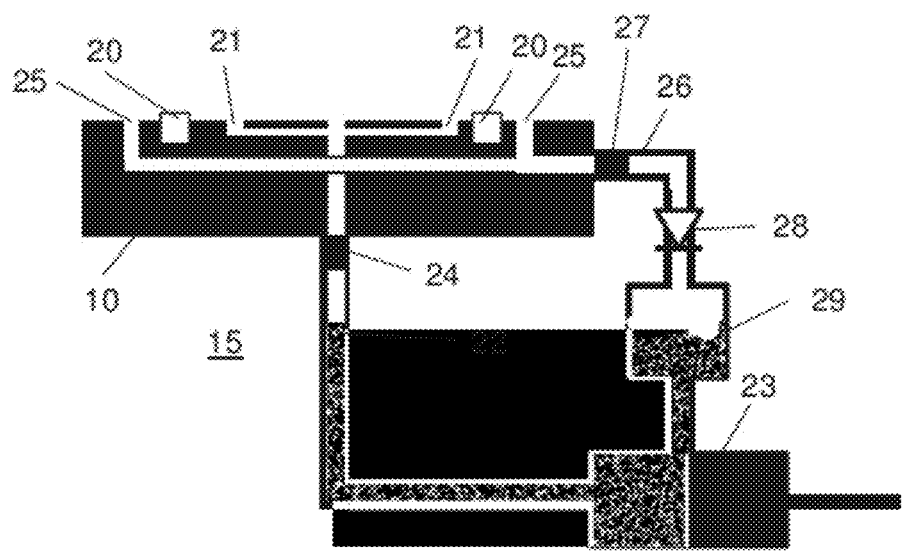
FIG. 6 is a schematic diagram illustrating in detail another embodiment of a workpiece/anvil interface applicable in the apparatus of FIG. 1 in a state of rest.

FIG. 6 is a schematic diagram illustrating in detail another embodiment of a workpiece/anvil interface 15 applicable in the apparatus of FIG. 1 in a state of rest. The workpiece/anvil interface 15 shown in FIG. 6 is similar to that shown in FIGS. 3-5, but includes an additional drain system that collects in openings 25 arranged in the second workpiece 9 fluid leaking over the seal 20 at the edges of the second workpiece 9. The fluid collected in the openings 25 is fed back to the pump 23 through a feedback tube 26 for another pumping cycle (recycling). In the feedback tube 26 between the openings 25 and the pump 23, another filter 27, a check valve 28 and a reservoir 29 for intermediate storage of fluid may be provided.

Figure 7:
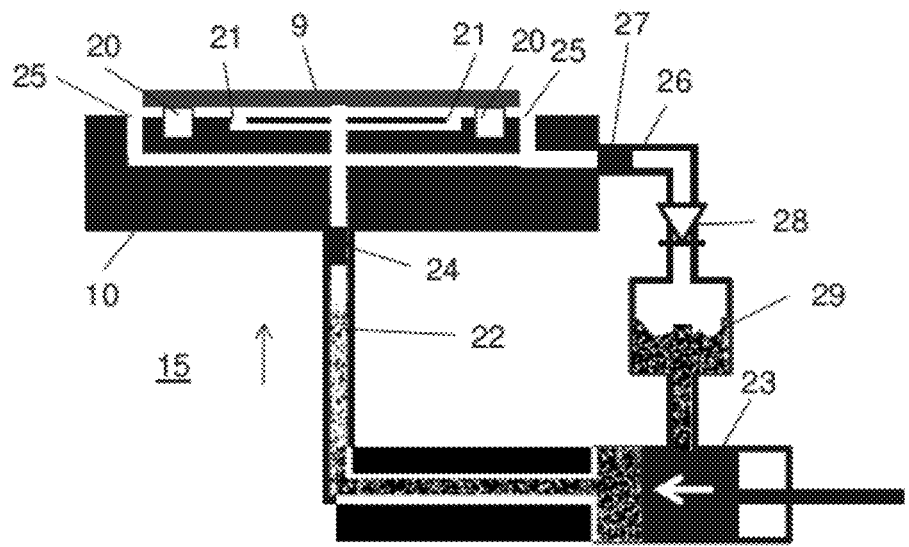
FIG. 7 is a schematic diagram illustrating in detail the workpiece/anvil interface of FIG. 6 in a filling state.

FIG. 7 shows the workpiece/anvil interface 15 of FIG. 6 in a filling state. In this state, no welding force is applied to the second workpiece 9 and the fluid rises until the fluid drains through apertures between the seal 20 and the second workpiece 9 and into the openings 25 and the tube 26 to the reservoir 29 where it is stored for the next pumping cycle.

Figure 8:
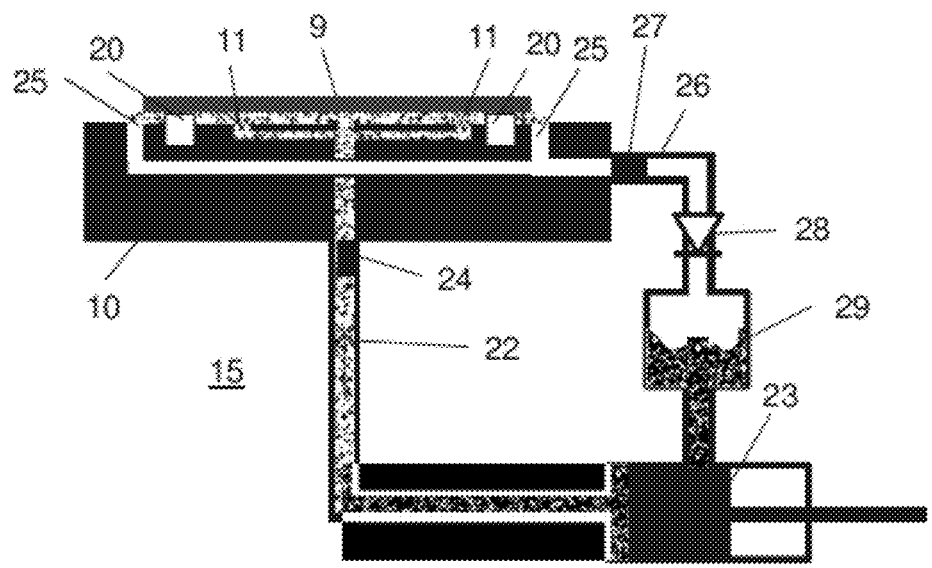
FIG. 8 is a schematic diagram illustrating in detail the workpiece/anvil interface of FIG. 6 in a filled-up state.

FIG. 8 is a schematic diagram illustrating in detail the workpiece/anvil interface 15 of FIG. 6 when it is in a filled-up state. In this state, still no welding force is applied to the second workpiece 9 and the fluid drains through apertures between the seal 20 and the second workpiece 9.

Figure 9:
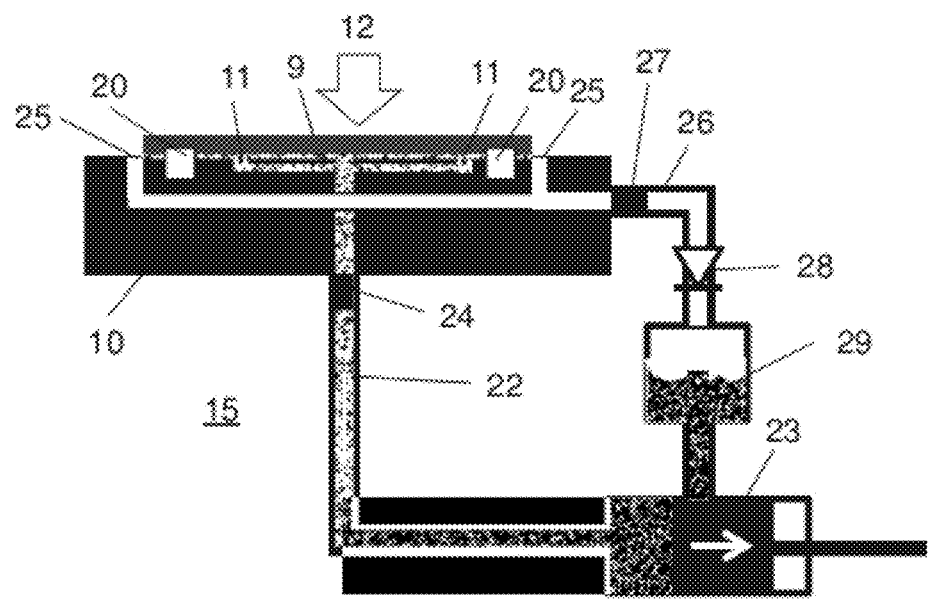
FIG. 9 is a schematic diagram illustrating in detail the workpiece/anvil interface of FIG. 6 in a tightened state.

FIG. 9 shows the workpiece/anvil interface 15 of FIG. 6 in a tightened state. In this state, welding force 12 is applied to the second workpiece 9 pressing the second workpiece 9 against the seal 20 so that no fluid drains anymore into the openings 25. However, the welding pressure 12 forces a certain quantity of fluid back to the pump 23. This action may be supported by the pump 23 by reducing pumping pressure or even reverse the pressure, i.e., sucking the fluid into the pump 23. The apparatus is now ready for welding.

Figure 10:
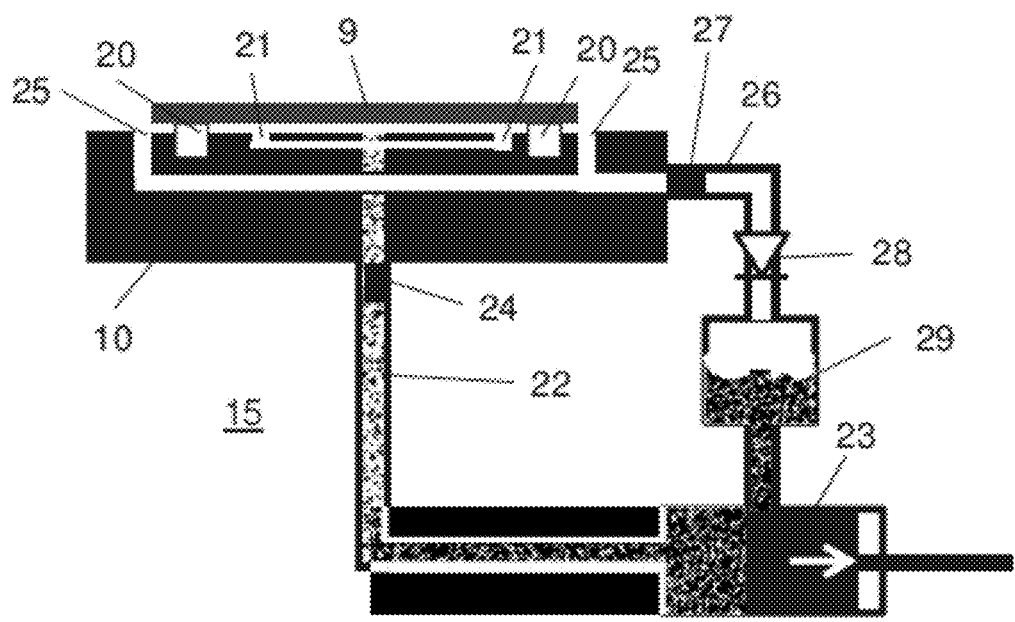
FIG. 10 is a schematic diagram illustrating in detail the workpiece/anvil interface of FIG. 6 in a released state.

FIG. 10 shows the workpiece/anvil interface 15 of FIG. 6 in a released state. In this state, no welding force is applied to the second workpiece 9 anymore and the fluid flows back into the pump 23 through tube 22.

Figure 11:
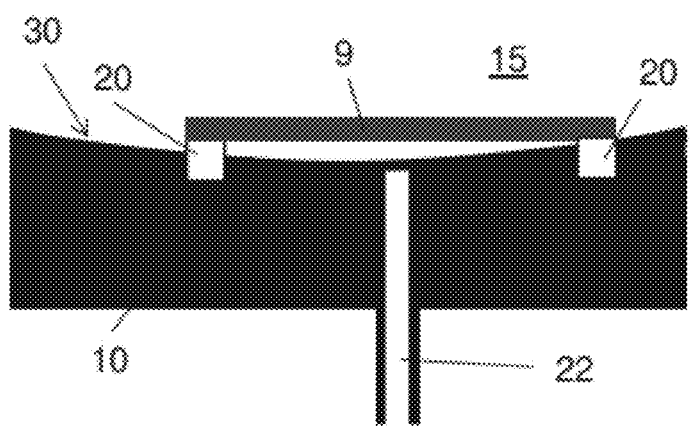
FIG. 11 is a schematic diagram illustrating in detail still another embodiment of a workpiece/anvil interface applicable in the apparatus of FIG. 1 in which the anvil is curved.

FIG. 11 is a schematic diagram illustrating in detail still another embodiment of a workpiece/anvil interface 15 applicable in the apparatus of FIG. 1 in which the upper surface of the anvil 10 is curved, in the present embodiment concave curved. A curved surface allows for even more stability of the second workpiece 9 in particular when it is curved and, thus, for even better welding results.

The fluid used in the embodiments may be or contain water, oil, alcohol, and mixtures and emulsions thereof. Suitable fluids may have one or more of the following characteristics:
a) a bulk modulus of more than $2.5 \cdot 10^9$ Pa, (i.e., it is essentially incompressible);
b) a surface tension between 20 Nm and 60 Nm;
c) sufficient penetrating capability;
d) a relatively high boiling point, e.g. above 150° C.;
e) a viscosity of between 2.5 and 150 mPa·s, e.g., 2.8 and 50 mPa·s;
f) a high shear stability, e.g., better than API SD standard;
g) non-Newtonian properties (the relation between the shear stress and the shear rate is different, and can even be time-dependent; therefore a constant coefficient of viscosity cannot be defined).

The apparatus of FIGS. 6-11 may be further configured to include at least one additional seal arranged such that the openings 25 are between the at least two seals. The seals may be common o-rings. In the filled-up state, the fluid may leak over the inner seal where it flows to the reservoir, but does not leak over the outer seal, thus forming a hermetically sealed fluid system. The improved workpiece/anvil interface 15 may be combined and controlled together with mechanical, hydraulic or pneumatic systems for generating the welding force. The fluid may alternatively be moved by vacuum or pneumatic systems.

Reference is now made to FIG. 12, which is a schematic diagram illustrating an exemplary ultrasonic welding apparatus for, in particular, ultrasonic welding of thin metals and/or ceramics with an improved workpiece/anvil interface. In a horizontally arranged, tubelike carriage 31 a transducer 32 (including a booster) is arranged such that the transducer 32 is in direct mechanical contact with a support collar 34 which is supported by a bearing 33. The support collar 34 is in direct mechanical contact with a sonotrode 37 which is supported on one side by a counter bearing 35 and which is in direct mechanical contact with a first workpiece 38, e.g., a contact element of a power-semiconductor module. The first workpiece 38 is in mechanical contact with a second workpiece 39, e.g., a plate-like ceramic substrate, a metallic base plate or a compound thereof as used in power-semiconductor modules. The second workpiece 39 rests on a flat upper surface of an anvil 40 but is not in direct mechanical contact with the anvil 40 as a fluid layer 41 (or fluid film) is arranged in between. A welding force 42 is applied to the sonotrode 37 such that the two workpieces 38, 39 are clamped between the sonotrode 37 and the anvil 40. The welding force 42 may be generated by a mechanical system (e.g. a spring or weight), a hydraulic system or by a pneumatic system which form in connection with the counter bearing 35, the sonotrode 37 and the anvil 40 the press. Horizontal ultrasonic vibrations 36 superposing the vertical welding force 42 are provided by the transducer 32 which is electrically connected to an electronic ultrasonic generator (not shown). A sonotrode/workpiece interface includes the sonotrode 37 and the first workpiece 38, and a workpiece/anvil interface includes the anvil 40, the second workpiece 39 and the fluid layer 41.

The improved workpiece/anvil interface disclosed herein reduces unwanted vibrations of the workpieces to a minimum. The improved workpiece/anvil interface can be easily combined with systems generating the welding force (welding pressure) and easily integrated into existing manufacturing processes. The reduction of the unwanted vibrations allows for a more precise and gentle welding so that ultrasonic welding is now suitable also for more sensitive and/or smaller workpieces, such as thin ceramic substrates and small contact elements. Furthermore, a welding apparatus using the improved workpiece/anvil interface may provide tensioning torque of more than 1 bar. Thus, e.g. ceramic substrates can be welded in a safe pressure range (in terms of breakage) and the curved shape of ceramic substrates can be flattened. If this is not desired, a curved anvil as illustrated above in connection with FIG. 11 may be used.

Further improvements can be achieved if the fluid introduced between the anvil and the workpiece is frozen to form a solid body that accommodates the irregular surfaces of the anvil and the workpiece to each other. Furthermore, as the fluid when it is in a frozen state adheres to some degree to both the anvil and the workpiece, it provides a stable workpiece position not only when the workpiece is pressed against the anvil but also when the workpiece is drawn away from the anvil so that the improved apparatus is well suited not only for ultrasound welding but also for ultrasound bonding. In the apparatuses described above with reference to FIGS. 1-12, a further step of freezing the fluid may be provided to allow for an even more stable position of the workpiece. As the workpiece is basically "fixed" to the anvil, fragile workpieces such as certain parts of, e.g., a power semiconductor module may be bonded. Apparatuses that are particularly suited for welding and bonding of power semiconductor modules are described below with reference to FIGS. 13-19.

An exemplary improved ultrasonic welding and bonding apparatus as shown in FIG. 13 has a freezer anvil 43 with a duct 44 through which a liquid coolant (not shown) is conducted. The coolant cools down the body of the anvil 43 such that the anvil reaches a temperature sufficient to freeze a liquid layer 45 (or film) arranged on the top surface of the anvil 43. A workpiece 46 rests on the layer 45 and by cooling the layer 45 such that it changes from the liquid state into the solid state, the workpiece 46 is adhered to the anvil 43. The workpiece 46 may be a power semiconductor module (or parts thereof) that has, e.g., an electrically and thermally conducting base plate 47, arranged thereon two electrically insulating and thermally conducting substrates 48 with electrically conducting structures (not shown), and active (semiconductor) and passive devices 49 arranged on top of the substrates 48. Contact elements 50 provide external electrical contact and bond wires 51 internally connect the devices 49 with each other and/or with the electrically conducting structures of the substrate 48.

Wire bonding is the process of providing an electrical connection between a silicon chip and external leads of a semiconductor device using very fine bonding wires. Wire diameters start at 15 μm and can be up to several hundred micrometers for high-powered applications. The wire used in wire bonding is usually made either of gold (Au) or aluminum (Al), although copper (Cu) wire bonding is increasingly used. There are, for instance, two common wire bonding processes: Au ball bonding and Al wedge bonding. During gold ball wire bonding, a gold ball is first formed by melting the end of the wire through electronic flame-off. The free-air ball has a diameter ranging from 1.5 to 2.5 times the wire diameter. The free-air ball is brought into contact with the bond pad. Adequate amounts of pressure, heat, and ultrasonic forces are then applied to the ball for a specific amount of time, forming the initial metallurgical weld between the ball and the bond pad as well as deforming the ball bond itself into its final shape. The wirebonding machine or wirebonder breaks the wire in preparation for the next wirebonding cycle by clamping the wire and raising the capillary. During aluminum wedge wire bonding, a clamped aluminum wire is brought in contact with the aluminum bond pad. Ultrasonic energy is then applied to the wire for a specific duration while being held down by a specific amount of force, forming the wedge-bond. As can be seen from the above, the underlying principles of all types of ultrasonic bonding are quite similar to those of ultrasonic welding so that adequate bonding tools are in principal quite similar to the welding tools shown in FIGS. 1-12. Therefore, no further tools are shown in FIGS. 13-19, instead the welding tools shown in FIGS. 1-12 are applicable for both welding and bonding in the following.

FIG. 14 shows another exemplary improved anvil 52 for ultrasonic welding and bonding. The anvil 52 has cavities 53 for expanding compressed gas flowing through a jet 54 into the cavities 53 where it is relaxed thereby refrigerating the body of the anvil 52. Refrigeration may be defined as lowering the temperature of an enclosed space by removing heat from that space and transferring it elsewhere. A device that performs this function may be called a freezer, chiller, refrigerator or heat pump. On top of the anvil 52 a fluid layer 55 is arranged that is to be frozen by the anvil 52. The (frozen) fluid layer 55 supports two (ceramic) substrates 56 that carry electrical contacts 57 and (semiconductor) devices 58 connected with each other by bond wires 59. The arrangement resting on the (frozen) fluid layer 55 is a power semiconductor module having two separate substrates 56 but no base plate.

Figure 15:
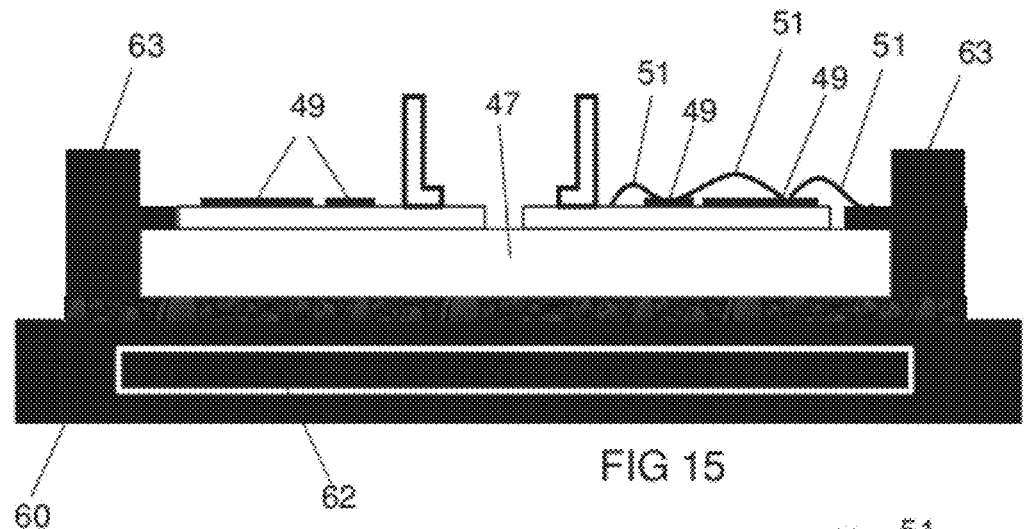
FIG. 15 is a schematic diagram illustrating an exemplary improved freezer anvil for ultrasonic welding and bonding in which a thermoelectric cooling element is used for refrigeration.
Figure 16:
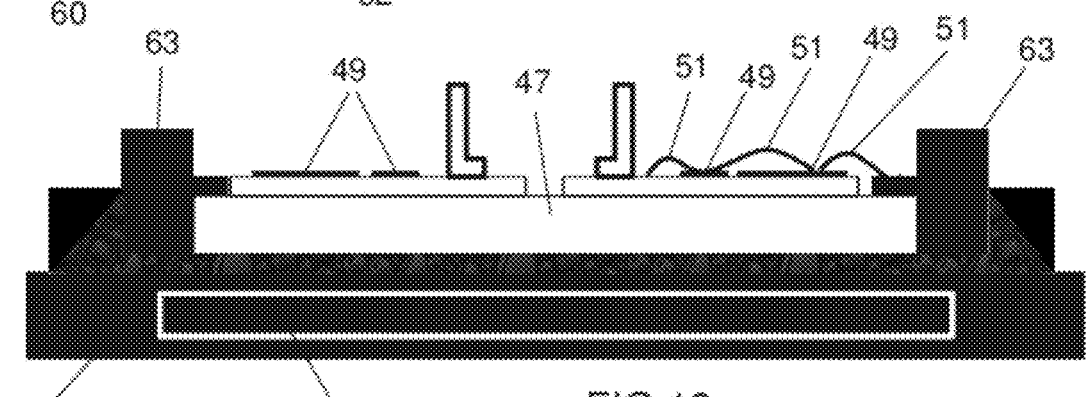
FIG. 16 is a schematic diagram illustrating another exemplary improved freezer anvil for ultrasonic welding and bonding in which a thermoelectric cooling element is used for refrigeration.
Figure 17:
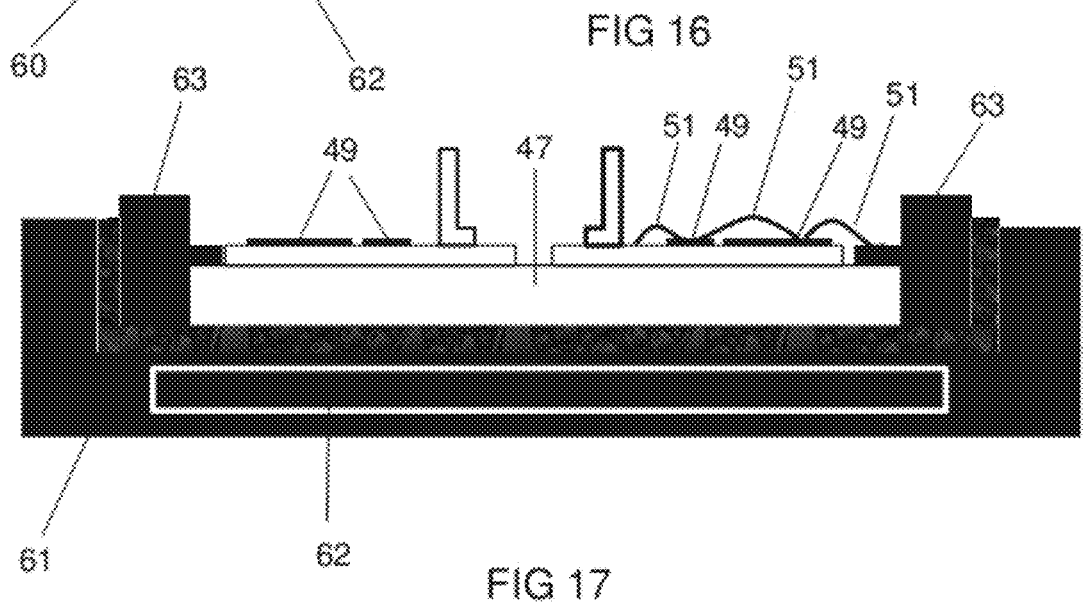
FIG. 17 is a schematic diagram illustrating still another an exemplary improved freezer anvil for ultrasonic welding and bonding in which a thermoelectric cooling element is used for refrigeration.

FIGS. 15-17 show examples of improved freezer anvils 60, 61, 62 for ultrasonic welding and bonding in which thermoelectric cooling elements, e.g., so-called Peltier elements 63, are used for refrigeration. Thermoelectric cooling uses the Peltier effect to create a heat flux between the junction of two different types of materials. A Peltier element is a solid-state active heat pump which transfers heat from one side of the device to the other side against the temperature gradient (from cold to hot), with consumption of electrical energy. The main advantages of a Peltier element are its lack of moving parts or circulating liquid, and its small size and flexible shape (form factor). In the present example, the Peltier elements 62 are integrated into the anvils 60 and 61.

The exemplary anvils shown in FIGS. 15-17 are used in connection with power semiconductor modules (or parts thereof) that are similar to the one described above in connection with FIG. 13 so that similar or identical components are labeled with the same reference numbers. However, an additional metal frame 63 surrounds the base plate 47 with substrates 48. Anvil 60 of FIGS. 15 and 16 has a flat upper surface and the frozen fluid film is also flat (FIG. 15) or exhibits edges of frozen fluid grown up on the outer circumference of frame 63. Anvil 61 of FIG. 17 has increased edges so that it forms a kind of pan or well.

Figure 18:
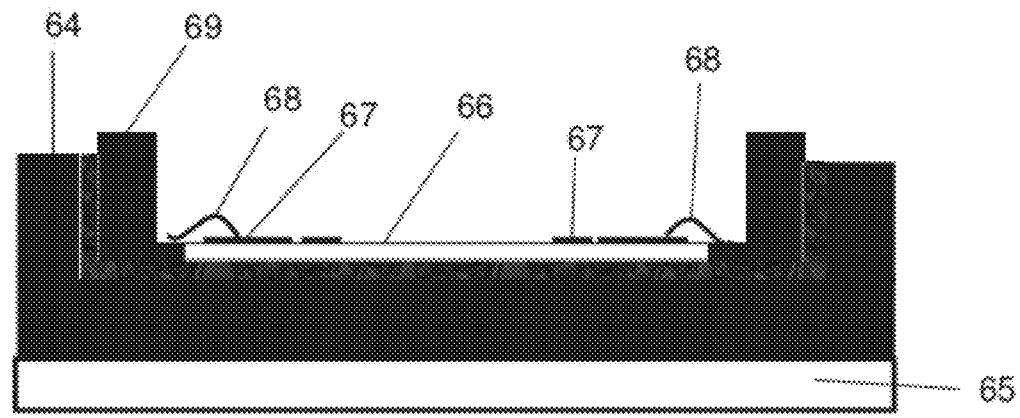
FIG. 18 is a schematic diagram illustrating an exemplary improved freezer anvil for ultrasonic welding and bonding in which the anvil is in thermal contact with an external cooling element.
Figure 19:
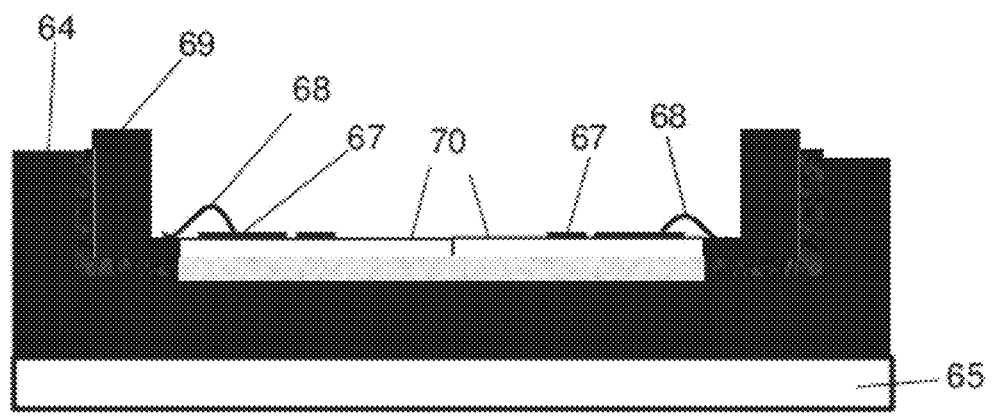
FIG. 19 is a schematic diagram illustrating another exemplary improved freezer anvil for ultrasonic welding and bonding in which the anvil is in thermal contact with an external cooling element.

Anvil 64 of FIG. 18 is similar to anvil 61 shown in FIG. 17, but employs for refrigeration an "external" cooling element 67 attached to the lower surface of anvil 64 instead of an "internal" Peltier element. The module shown in FIG. 18 includes substrate 66 with, e.g., power semiconductor devices 67, bond wires 68 and a frame 69. In the example shown in FIG. 19, a module is used that has two substrates 70 held together by the frame 69.

FIGS. 13-19 depict different types of anvils with frozen liquid layers on top, that support power semiconductor modules (or parts thereof) in a state shortly after the welding and/or bonding process. Subsequently, the frozen layer is melted and the module is removed from the anvils.

The improved anvils allow both ultrasonic welding (15-40 kHz) and ultrasonic bonding (40-100 kHz) of a wide variety of workpieces and other devices, e.g., frames, substrates, contacts, chips, thin wire (<15 μm) and thick wire (15-600 μm) made from gold, copper, aluminum and their alloys, since the anvil halters the workpiece in an absolutely stable position, i.e., any movement up and down, back and forth, and left and right is prevented. The fluid layer in a frozen state may have a thickness of below 0.20 mm, but may reach some millimeters in certain areas. The improved anvil may comprise at least two areas or segments that are cooled separately from each other. For instance, the cavities 53 in the anvil 52 shown in FIG. 14 may be operated with different pressure differences resulting in different partial temperatures. To further increase the temperature gradient, the anvil 52 may be divided into a multiplicity of segments (in the present example three segments 52a, 52b, 52c) in which at least two segments may be thermally insulated from each other by insulator layers 71 (FIG. 14). Segmentation per se and, particularly, in connection with the insulating layers 71 helps avoiding condensation of vapor in certain areas.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for ultrasonic welding or bonding of a first workpiece to a second workpiece, comprising:
   clamping the two workpieces between a sonotrode and an anvil so that the two workpieces are in mechanical contact with each other, the first workpiece is in mechanical contact with the sonotrode, and the second workpiece rests on the anvil;
   introducing fluid between the second workpiece and the anvil so that the second workpiece at least partly rests on the fluid;
   freezing the fluid so that the fluid forms a solid body; and
   applying ultrasonic vibrations to the first workpiece by the sonotrode for a period of time while the second workpiece rests on the solid body.

2. The method of claim 1, wherein the fluid is introduced by pumping the fluid between the second workpiece and the anvil.

3. The method of claim 2, further comprising:
   collecting leaking fluid at or near the second workpiece; and
   pumping the collected fluid between the second workpiece and the anvil.

4. The method of claim 3, wherein the collected fluid is stored in a reservoir prior to being pumped again between the second workpiece and the anvil.

5. The method of claim 1, further comprising providing a sealed cavity between the second work piece and the anvil prior to introducing the fluid.

6. The method of claim 5, wherein the sealed cavity is filled up with the fluid prior to clamping the workpieces and pressing and/or sucking the fluid out of the cavity.

7. The method of one claim 1, wherein the fluid comprises water, oil or alcohol.

8. The method of claim 1, wherein the fluid has one or more of the following characteristics:
   a bulk modulus of more than $2.5 \cdot 10^9$ Pa;
   a surface tension between 20 Nm and 60 Nm;
   a relatively high boiling point, e.g. above 150° C.;
   a viscosity of between 2.5 and 150 mPa·s; and
   non-Newtonian properties.

9. The method of claim 1, wherein the fluid is filtered prior to pumping or upon pumping or both.

10. The method of claim 1, wherein the first workpiece is an electrical contact element and the second workpiece comprises a substrate or a base plate of a power semiconductor module or a compound thereof.

11. The method of claim 1, wherein freezing the fluid so that the fluid forms a solid body comprises cooling the anvil by expanding compressed gas in or near the anvil.

12. The method of claim 1, wherein freezing the fluid so that the fluid forms a solid body comprises cooling the anvil by passing a liquid coolant through or to the anvil.

13. The method of claim 1, wherein freezing the fluid so that the fluid forms a solid body comprises cooling the anvil by using the Peltier effect.

14. The method of claim 1, wherein the anvil is cooled such that different temperatures at different areas of the anvil occur.

* * * * *